(12) United States Patent
Le et al.

(10) Patent No.: US 6,515,903 B1
(45) Date of Patent: Feb. 4, 2003

(54) NEGATIVE PUMP REGULATOR USING MOS CAPACITOR

(75) Inventors: Binh Q. Le, San Jose, CA (US); Pau-Lin Chen, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/050,254

(22) Filed: Jan. 16, 2002

(51) Int. Cl.[7] .............................................. G11C 16/04
(52) U.S. Cl. .......................... 365/185.18; 365/189.09; 365/226; 327/536
(58) Field of Search ................ 365/185.18, 189.09, 365/226; 327/534, 535, 536, 537

(56) References Cited

U.S. PATENT DOCUMENTS

| | | |
|---|---|---|
| 5,263,000 A | 11/1993 | Van Buskirk et al. |
| 5,291,446 A | 3/1994 | Van Buskirk et al. |
| 5,831,845 A * | 11/1998 | Zhou et al. ................... 363/60 |
| 6,208,124 B1 | 3/2001 | Fuchigami et al. |
| 6,359,947 B1 * | 3/2002 | Rao ............................ 327/536 |
| 6,366,519 B1 * | 4/2002 | Hung et al. ................. 365/226 |

OTHER PUBLICATIONS

US 5,612,921, 3/1997, Chang et al. (withdrawn)

* cited by examiner

Primary Examiner—Son Mai
(74) Attorney, Agent, or Firm—Eschweiler & Associates, LLC

(57) ABSTRACT

A system is disclosed for generating a regulated negative charge pump voltage for flash memory operations, wherein a capacitive voltage divider circuit comprising one or more MOS capacitors is configured to respond to the regulated output voltage of a negative charge pump circuit and an output circuit source loading and generate a voltage divider output signal associated therewith. The system also includes an initialization circuit which is configured to precharge the capacitors of the MOS capacitor voltage divider with a reference voltage. The system further includes a bias circuit operable to generate a bias voltage which is used in association with the MOS capacitors to insure they operate above a bias voltage which will maintain a minimum target capacitance within the voltage divider, resulting in a stable target regulation voltage. The negative regulator also includes an output circuit operable to source the negative charge pump output voltage to a supply voltage, and a negative regulator control circuit operably coupled to the initialization circuit and the capacitive voltage divider circuit, and operable to receive the bias circuit voltage and the associated MOS capacitor voltage divider circuit output, and operable to receive a negative charge pump output voltage and regulate an output circuit source loading via the supply voltage to produce a feedback to the negative charge pump circuit based on the target voltage value established by the MOS capacitor voltage divider, thereby creating a reduced area negative regulator used in conjunction with a negative charge pump circuit, which maintains a low power and simple regulator design, to produce a regulated charge pump output which may be used as a pumped voltage for various mode operations of memory cells.

15 Claims, 11 Drawing Sheets

NEGATIVE PUMP REGULATOR USING MOS CAPACITOR

FIELD OF INVENTION

The present invention relates generally to memory systems such as a flash memory array system. More particularly, the present invention relates to an improved negative regulator circuit for a negative charge pump circuit, wherein a voltage divider circuit uses MOS capacitors, and a bias circuit which supplies a bias voltage used in association with the MOS capacitors insuring they operate at voltages which will maintain a minimum target capacitance. The regulated negative voltage may be applied to a wordline, for example, for erase mode operations of memory cells.

BACKGROUND OF THE INVENTION

Flash and other types of electronic memory devices are constructed of thousands or millions of memory cells, adapted to individually store and provide access to data. A typical memory cell stores a single binary piece of information referred to as a bit, which has one of two possible states. The cells are commonly organized into multiple cell units such as bytes which comprise eight cells, and words which may include sixteen or more such cells, usually configured in multiples of eight. Storage of data in such memory device architectures is performed by writing to a particular set of memory cells, sometimes referred to as programming the cells. Retrieval of data from the cells is accomplished in a read operation. In addition to programming and read operations, groups of cells in a memory device may be erased, wherein each cell in the group is programmed to a known state.

The individual cells are organized into individually addressable units or groups such as bytes or words, which are accessed for read or program operations through address decoding circuitry, whereby such operations may be performed on the cells within a specific byte or word. The individual memory cells are typically comprised of a semiconductor structure adapted for storing a bit of data. For instance, many conventional memory cells include a metal oxide semiconductor (MOS) device, such as a transistor in which a binary piece of information may be retained. The memory device includes appropriate decoding and group selection circuitry to address such bytes or words, as well as circuitry to provide voltages to the cells being operated on in order to achieve the desired operation.

The erase, program, and read operations are commonly performed by application of appropriate voltages to certain terminals of the cell MOS device. In an erase or program operation the voltages are applied so as to cause a charge to be stored in the memory cell. In a read operation, appropriate voltages are applied so as to cause a current to flow in the cell, wherein the amount of such current is indicative of the value of the data stored in the cell. The memory device includes appropriate circuitry to sense the resulting cell current in order to determine the data stored therein, which is then provided to data bus terminals of the device for access to other devices in a system in which the memory device is employed.

Flash memory is a type of electronic memory media which can be rewritten and hold its content without power. Flash memory devices generally have life spans from 100 K to 1 MEG write cycles. Unlike dynamic random access memory (DRAM) and static random access memory (SRAM) memory chips, in which a single byte can be erased, flash memory is typically erased and written in fixed multi-bit blocks or sectors. Conventional flash memories are constructed in a cell structure wherein a single bit of information is stored in each flash memory cell. In such single bit memory architectures, each cell typically includes a MOS transistor structure having a source, a drain, and a channel in a substrate or P-well, as well as a stacked gate structure overlying the channel. The stacked gate may further include a thin gate dielectric layer (sometimes referred to as a tunnel oxide) formed on the surface of the P-well. The stacked gate also includes a polysilicon floating gate overlying the tunnel oxide and an interpoly dielectric layer overlying the floating gate. The interpoly dielectric layer is often a multilayer insulator such as an oxide-nitride-oxide (ONO) layer having two oxide layers sandwiching a nitride layer. Lastly, a polysilicon control gate overlies the interpoly dielectric layer.

FIG. 1 illustrates a typical NOR configuration 100, wherein the control gate 110 is connected to a word line (e.g., WL0 thru WL3) associated with a row of such cells 120 to form sectors of such cells. In addition, the drain regions 130 of the cells are connected together by a conductive bit line (e.g., BL0 thru BL3). The channel of the cell conducts current between the source 140 and the drain 130 in accordance with an electric field developed in the channel by the stacked gate structure. In the NOR configuration, each drain terminal 130 of the transistors 120 within a single column is connected to the same bit line. In addition, each flash cell 120 associated with a given bit line has its stacked gate terminal 110 coupled to a different word line (e.g., WL1 thru WL4), while all the flash cells in the array have their source terminals 140 coupled to a common source terminal (CS). In operation, individual flash cells 120 are addressed via the respective bit line and word line using peripheral decoder and control circuitry for programming (writing), reading or erasing functions.

Such a single bit stacked gate flash memory cell is programmed, for example, by applying a relatively high voltage to the control gate and connecting the source to ground and the drain to a predetermined potential above the source. A resulting high electric field across the tunnel oxide leads to a phenomena called "Fowler-Nordheim" tunneling. During this process, electrons in the core cell channel region tunnel through the gate oxide into the floating gate and become trapped in the floating gate since the floating gate is surrounded by the interpoly dielectric and the tunnel oxide. As a result of the trapped electrons, the threshold voltage of the cell increases. This change in the threshold voltage (and thereby the channel conductance) of the cell created by the trapped electrons is what causes the cell to be programmed.

In order to erase a typical single bit stacked gate flash memory cell, a relatively high voltage is applied to the source, and the control gate is held at a negative potential, while the drain is allowed to float. Under these conditions, a strong electric field is developed across the tunnel oxide between the floating gate and the source. The electrons that are trapped in the floating gate flow toward and cluster at the portion of the floating gate overlying the source region and are extracted from the floating gate and into the source region by way of Fowler-Nordheim tunneling through the tunnel oxide. As the electrons are removed from the floating gate, the cell is erased.

For a read operation, a certain voltage bias is applied across the drain to source of the cell transistor. The drain of the cell is the bit line, which may be connected to the drains of other cells in a byte or word group. The voltage at the drain in conventional stacked gate memory cells is typically provided at between 0.5 and 1.0 volts in a read operation. A voltage is then applied to the gate (e.g., the word line) of the memory cell transistor in order to cause a current to flow from the drain to source. The read operation gate voltage is typically applied at a level between a programmed threshold voltage ($V_T$) and an unprogrammed threshold voltage. The resulting current is measured, by which a determination is made as to the data value stored in the cell.

More recently, dual bit flash memory cells have been introduced, which allow the storage of two bits of information in a single memory cell. The bitline (drain), and wordline (gate) voltages required for dual bit memory cells is typically higher than that of single bit, stacked gate architecture memory cells, due to the physical construction of the dual bit cell.

In these semiconductor applications, a charge pump sometimes is used to increase a small input, or supply voltage (for example, $V_{CC}$) to a larger voltage that is passed to the word lines or bit lines of the semiconductor memory devices. For example, some dual bit memory cell architectures require about 9.5 volts to properly bias the word lines, about 6 volts for the bitline or drain of such cells, and between −6 to −8 volts for negative erase voltages, for the various memory operations discussed. These voltages which are all higher than the applied supply voltage, are all created and fed by charge pumps to increase the supply voltage to the output voltage desired. These voltages affect the reading, writing, and erasing of data from/to the memory device, and as such, often need the addition of a regulation circuit to maintain the accuracy of the charge pump output voltage for the various memory operations.

Because these charge pump voltages applied to the memory cell are derived from the memory device supply voltage ($V_{CC}$), the ability to provide the higher voltage required for the newer dual bit memory cells may be impaired when the supply voltage is at or near lower rated levels. In addition, low power applications for memory devices, such as cellular telephones, laptop computers, and the like, may further reduce the supply voltage available. To overcome the extremes of input $V_{CC}$ voltages applied to a charge pump and the variations which would otherwise be reflected in the output, a charge pump regulation circuit will also be employed.

Currently, conventional regulation circuits for charge pumps are constructed using several types of voltage dividers. As the required voltages for applications increases, the number of stages necessary to generate the higher output voltages also increases.

FIG. 2 provides an illustration of a conventional negative regulation circuit for a charge pump. The conventional negative charge pump regulator 200 regulates the output NEGP 240 of the negative charge pump 235. The output of the charge pump is divided down across a conventional metal-oxide-metal capacitor voltage divider $C_1$ (250) and $C_2$ (255) to produce a voltage divider voltage VDIV. VDIV 265 is compared to ground 270 in the differential amplifier comparator 260 to yield a comparison result VCOMP 275, which is applied as feedback to the gate of an output transistor 278. When the charge pump output tries to go lower than some target regulation voltage, the regulator output transistor 278 turns-on to pull the negative charge pump 235 output NEGP 240 up. When the charge pump output goes higher than the target regulation voltage, the output transistor 278 will turn-off to allow the negative charge pump output to continue down to a lower voltage.

The conventional negative charge pump regulator 200 also has a VREF input 225 and a PRECHARGE transistor input 220, provided for initializing the capacitors in the voltage divider to a predetermined value VREF 225. Unlike a resistor voltage divider which has a continuous DC self biasing, a capacitor divider must be preset or precharged to a predetermined initial voltage so the voltage divider can function properly. In the conventional negative charge pump regulator 200, VREF 225 is coupled to $C_1$ (250) and $C_2$ (255) to initially apply VREF across each of the capacitors, when NEGP is initially at ground.

In operation, the negative pump regulator 200, will initialize the capacitive divider by precharging $C_1$ (250) and $C_2$ (255) thru transistor 245 to the voltage at VREF 225.

Initially, the NEGP output 240 of the charge pump 235 is at ground potential. After the precharge interval, the charge pump is enabled and will begin to charge. The negative regulator 200, will begin to regulate the output voltage at NEGP 240 when the voltage at the VDIV 265 non-inverting terminal has been pulled down to about zero volts (roughly equaling the same voltage which is on the inverting terminal 270 of the comparator). Note that at this point of regulation, that the voltage across $C_1$ is zero volts, while the voltage across C2 is the negative pump output voltage NEGP−VDIV=NEGP−0=NEGP.

FIG. 3 is an illustration of the conventional metal-oxide-metal capacitors which are used in the capacitor voltage divider of the conventional negative regulator circuit of FIG. 2. The conventional metal capacitor 280, is basically two metal plates M1 (294) and M2 (290) separated by an oxide insulation layer 292. The conventional metal capacitor 280 is isolated by another oxide insulation layer 296 from the base substrate material 285. The oxide layer 292 acts as the dielectric material for the capacitor, and must be made relatively thick in the metal-oxide-metal capacitor manufacturing. Because of the thickness of this dielectric, the conventional metal capacitors must be large, and therefore require a large area of the semiconductor for the conventional negative regulator using these metal capacitors.

As most device applications seek to consume a minimum of semiconductor die area to keep the size of a device down, size becomes particularly important in portable device applications. Accordingly, there is a need for reducing the area required for a negative regulator used in conjunction with a negative charge pump circuit, while maintaining a low power, simple regulator design.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Its primary purpose is to present some concepts of the invention in a simplified form as a prelude to the more detailed description that is presented later.

The invention is directed to an improved, reduced area negative regulator circuit for a negative charge pump where one or more capacitors of the negative regulator voltage divider is characterized by having a MOS capacitor, and a bias circuit which supplies a bias voltage used in association with the MOS capacitors insuring they operate above a minimum voltage which will maintain a minimum target capacitance.

In the present invention of flash memory array systems and methods for producing a negative charge pump regulator circuit with reduced area, the use of MOS capacitors is employed in the voltage divider of a negative regulator circuit applied to a negative charge pump circuit which may be used to generate a negative voltage for various operations of memory cells.

MOS capacitors are preferred over metal-oxide-metal (MOM) capacitors, as MOS capacitors only require about 1/10th the area of the same value MOM capacitor. This dramatic increase in capacitance per unit area is possible with the MOS capacitor, because MOS capacitors are able to be manufactured with a much thinner $SiO_2$ (Silicon Dioxide) dielectric insulating layer. MOS capacitors however, unlike MOM capacitors, are still semiconductors requiring a bias voltage across their plates to prevent their capacitance value from dropping too low. The present invention overcomes this limitation with a bias circuit which generates this bias voltage on the MOS capacitors to maintain a minimum target capacitance, while taking advantage of the area savings of MOS capacitors.

Simply, the bias circuit generates a bias voltage to a differential amplifier in the regulator for comparison to a voltage produced by the voltage divider circuit. As circuit feedback to the differential amplifier seeks to zero the difference across its inputs, the bias voltage insures that the voltage generated at the voltage divider circuit will also oscillate about the bias voltage value during regulation. In this way, the bias voltage insures that at a minimum, an equivalent voltage is also applied to the capacitors in the voltage divider, and a minimum target capacitance is maintained.

The negative regulator also contains an initialization circuit which precharges the voltage divider capacitors to a reference voltage. An output circuit is also provided to shunt the output of the charge pump to the supply voltage (e.g., $V_{CC}$) when the output attempts to go lower than a predetermined regulation voltage.

Thus, a feature of the negative regulator of the present invention is that it requires less area than conventional negative charge pump regulators, as the MOS capacitors which are used in the voltage divider can be made much smaller in area than comparable MOM capacitors, thereby substantially reducing the area required for the negative regulator.

An advantage of the present invention is the ability of the negative regulator system to produce a more accurate voltage divider output, as compared to a conventional MOS capacitor voltage divider systems without the bias voltage. Without this bias circuit voltage, a conventional system based on the MOS capacitor, would experience widely varying voltage divider ratios over the range of regulation voltages it encountered, resulting in a widely varying output regulation voltage.

According to one aspect of the present invention, a sense and control circuit is included to provide capacitance selection to a capacitor of the capacitive voltage divider, to permit adjustment of the voltage divider ratio, and the resultant negative output voltage value. For example, where manufacturing tolerances of the capacitor values may vary over a wide range, the selection of a combination of trimming capacitors may provide better accuracy in the divider. Consequently, the present invention provides a negative regulator with a reduced area for regulating a charge pump output voltage, for example, a wordline voltage, which facilitates accurate operation of flash memory cells despite fluctuations in the load, supply voltage, or the charge pump.

The aspects of the invention find application in devices which include dual bit memory cells requiring higher bitline and wordline voltages than single bit cells, and in association with portable memory devices employed in varying supply voltage and low power applications.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
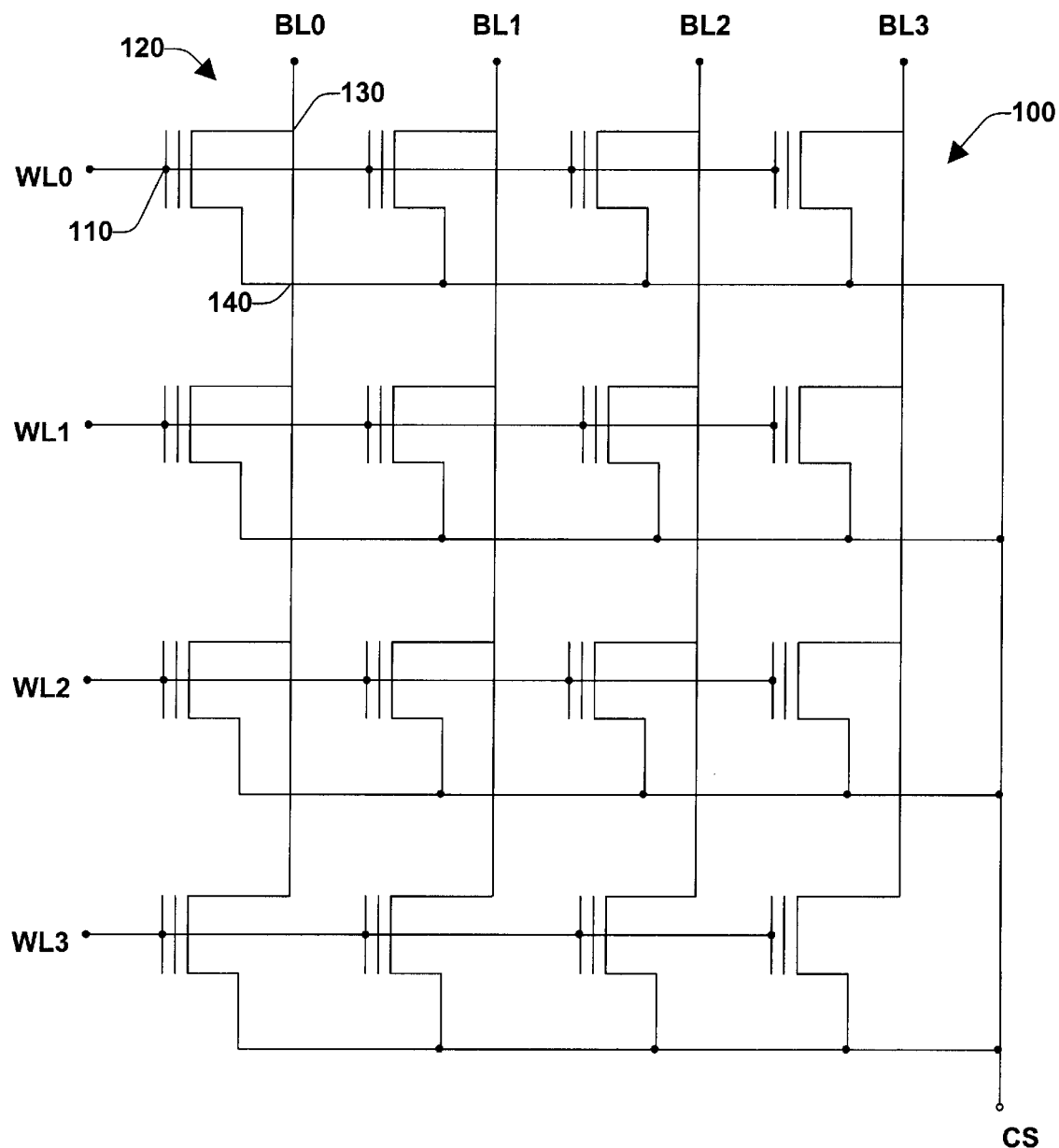
FIG. 1 is aschematic diagram which illustrates a conventional NOR flash memory architecture.
Figure 2:
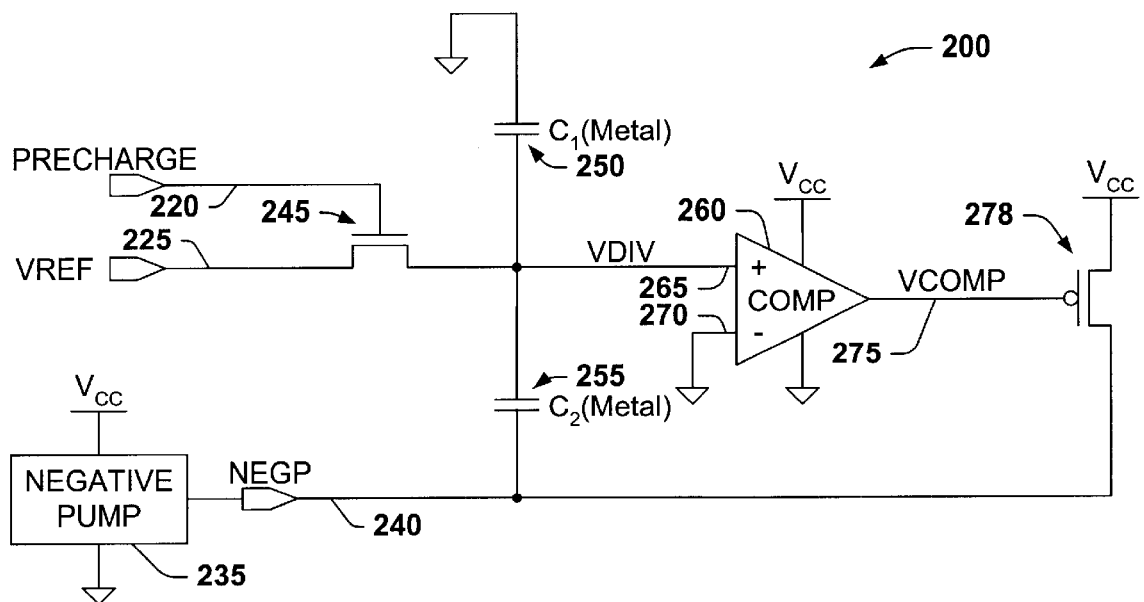
FIG. 2 illustrates a conventional negative regulator circuit for regulating the output voltage of a negative charge pump.
Figure 3:
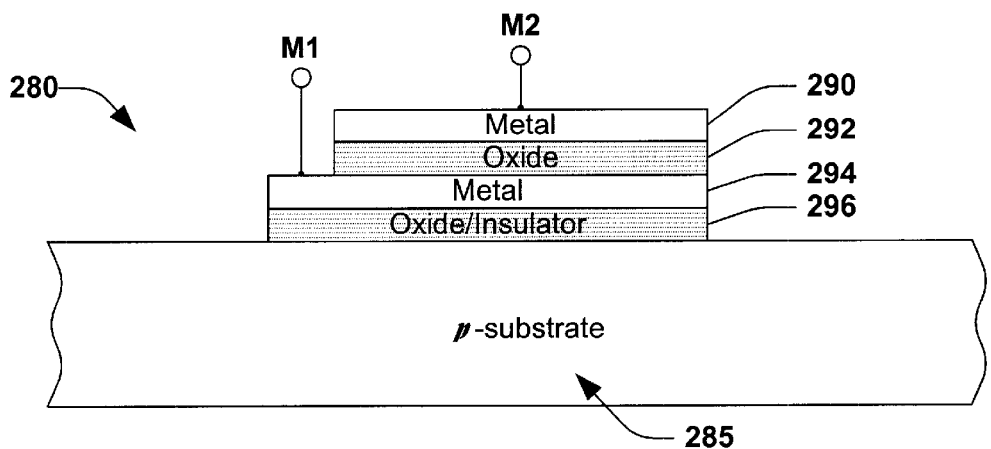
FIG. 3 is a partial cross-sectional view of a conventional metal-oxide-metal (MOM) capacitor constructed on a substrate.

The present invention will now be described with reference to the drawings, wherein like reference numerals are used to refer to like elements throughout. The present invention relates to a flash memory array circuit for producing an improved reduced area negative charge pump regulator which uses one or more MOS capacitors in a voltage divider, together with a bias circuit which supplies a bias voltage used in association with the MOS capacitors to insure they operate above a voltage which will maintain a minimum target capacitance within the voltage divider and result in a stable target regulation voltage. The present invention provides a negative regulator with a reduced area for regulating a charge pump output voltage, for example, a wordline voltage, which facilitates accurate operations of flash memory cells despite fluctuations in the load, supply voltage, or the charge pump.

In another prior art regulator resistor dividers where used. However, a high resistance is required for reducing the current which flows from the output terminal of the regulator through the resistors. This is disadvantageous in respect of the area. N type or P type diode-junction MOS transistors connected in series, with delicately controlled $V_T$ biasing have also been attempted as voltage dividers, but with very limited success. In comparison to these other dividers, the capacitor divider requires initialization of the capacitors, but the current that flows in the voltage divider is significantly reduced because the divider has no DC component, so requires less power. Thus the capacitor divider is generally preferred over a resistor divider or the diode-connected transistor divider scheme when used in a charge pump regulator circuit.

Figure 4A:
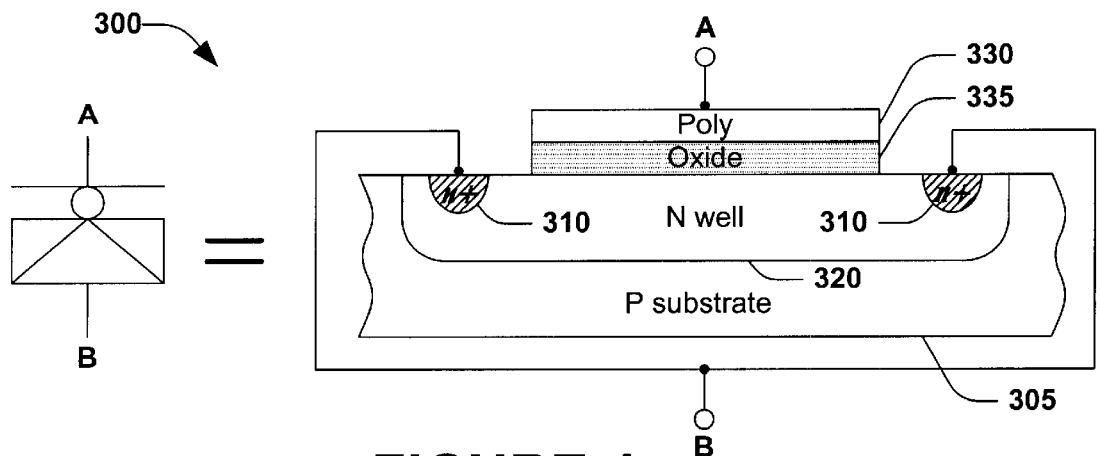
FIG. 4a is a partial cross-sectional view of a MOS capacitor constructed in an nwell which resides in a p-type substrate and illustrated with an associated schematic symbol in accordance with an aspect of the invention.
Figure 4B:
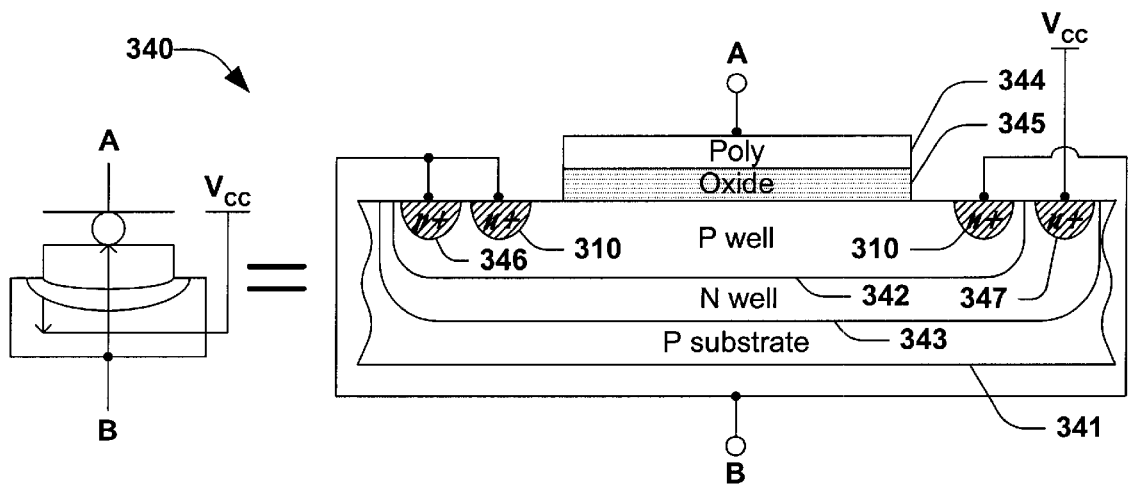
FIG. 4b is a partial cross-sectional view of a MOS capacitor constructed in a p-well within an n-well which resides in a p-type substrate and illustrated with an associated schematic symbol in accordance with an aspect of the invention.

FIG. 4a illustrates a partial cross-sectional view of a MOS capacitor 300 constructed in an n-well which resides in ap-type substrate and illustrated with an associated schematic symbol in accordance with an aspect of the invention. FIG. 4b (C1 of FIG. 7) is a partial cross-sectional view of a MOS 340 capacitor constructed in a p-well within an n-well which resides in a p-type substrate and illustrated with an associated schematic symbol in accordance with an aspect of the invention. Note that the acronym MOS stems from the early days of MOS fabrication when all gates were made of metal (aluminum). While heavily doped polysilicon has replaced aluminum as the standard gate material, the name MOS continues to be used.

The structure of the MOS capacitor (or MOS-C) is shown in FIGS. 4a. It consists of the generic MOS structure with terminals A and B connected such that one plate of the capacitor is poly and other plate is the n-well, respectively, making it a two-terminal device. An external bias can be applied across these terminals A and B ($V_{AB}$ or $V_{BA}$, respectively).

Figure 5:
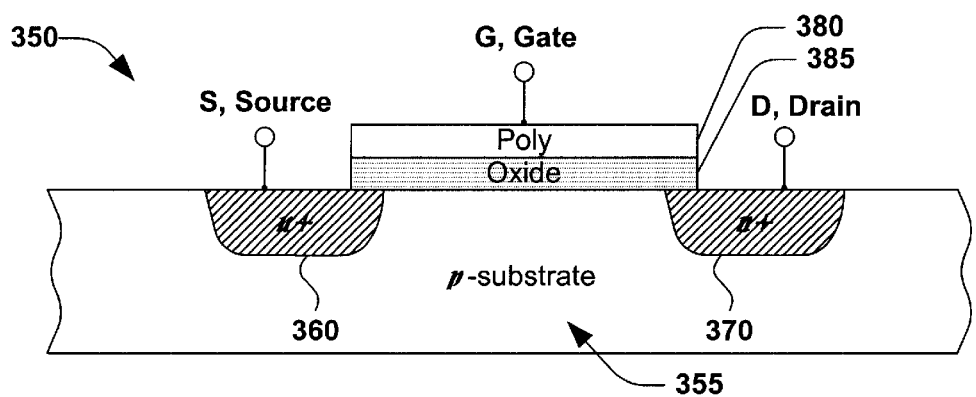
FIG. 5 is a partial cross-sectional view of a conventional MOS transistor constructed on a p type substrate, for comparison purposes.

As shown in FIGS. 4a and 5, the MOS-C forms the heart of the MOSFET sharing several similarities, and so will be compared. The exemplary MOS capacitor of FIG. 4a is built in an n-well 320 which resides in a p-type substrate 305. The n-well 320 acts as one plate of the capacitor 300, with the electrode B connected to highly doped (n-well) contact regions 310, which are connected to the same potential within the n-well 320. The other plate of the MOS capacitor 300 is a polysilicon layer 330 connected to the gate electrode A. The two plates of the MOS capacitor 300 are separated by a very thin (~160 Å) $SiO_2$ dielectric layer 335. This very thin oxide layer 335 accounts for the dramatically higher (10x) capacitance per unit area of the MOS capacitor over the conventional metal-oxide-metal (MOM) type capacitor which requires a much thicker dielectric layer between the metal plates due to current manufacturing limitations. (Note that capacitance is inversely proportional to the square of the distance between the plates.) Also shown in FIG. 4a, is an associated schematic symbol for the MOS-C.

Another variation of the MOS-C is shown in FIG. 4b (C1 of FIG. 7) and an associated schematic symbol. FIG. 4b is like FIG. 4a but is built in a p-well within an n-well which resides in a p-type substrate, to effectively reverse the bias polarity of the MOS-C. The MOS-C 340 resides in a substrate (e.g., p-type), but is built in a p-well 342 which forms one plate of the capacitor 340 with the n-type connect terminals 310 and a p-type connect terminal 346 connected to the same potential as terminal or electrode B. To reverse the polarity of this MOS-C, the p-well of the aforementioned resides within an n-well 343 with a highly doped (n-type) contact region 347 biased to VCC. The other plate of the MOS capacitor 340 is a polysilicon layer 344 connected to the gate electrode A. The plates of the MOS capacitor 340 are also separated by a very thin (~160 Å) $SiO_2$ dielectric layer 345, with the same high capacitance per unit area of the MOS capacitor of FIG. 4a. It should be noted that the substrate of FIGS. 4a and 4b are each connected to ground (0v), and thus the substrate are not a plate of the capacitors 300 and 340, respectively.

FIG. 5 is a partial cross-sectional view of a conventional MOS transistor 350 constructed on a p-type substrate 355, shown for comparison to illustrate its similarity to the MOS capacitor 300. Like the MOS-C, the MOS transistor also has an oxide layer 385 on the substrate to isolate the gate G layer 380, which is as stated, now usually constructed of a heavily doped polysilicon material.

The structure of the MOS field-effect-transistor (or MOSFET) 350 has two regions of doping opposite that of the substrate, one at each edge of the MOS structure 350. These regions are called the source S region 360 and drain D region 370, and a pn junction exists between them and the substrate.

The structure and behavior of the MOS-C differs from that of the more conventional metal-oxide-metal (MOM) capacitor structure, wherein the oxide layer acts as the dielectric material of a capacitor. That is, in the latter structure both terminals are highly conductive, but in the MOS-C the semiconductor terminal is not of high conductivity. Consequently, if a potential difference is applied across the terminal of the conventional capacitor, and electric field arises within the dielectric, but is zero outside the dielectric. This implies that the MOM capacitor stores all of the charge at the interfaces of the respective metal electrodes and the dielectric.

The situation is different in the MOS-C of FIG. 4a, where at least one of the terminals of the capacitor is a semiconductor, not a metal. In the case of an n-type semiconductor, then the application of a positive bias will accumulate negative charge between the semiconductor interface and the oxide. The high conductivity of the gate requires that the electric field within the dielectric again terminates at the gate-dielectric interface. Here, the charge on which the field lines terminate is the positive charge stored on the gate. At the substrate-dielectric interface, however, the semiconductor must supply negative charge to balance the gate's positive charge. This can readily occur because the majority mobile charge carriers in n-type Si are electrons, implying that (1) they exist in great abundance and (2) that they are capable of moving to the interface in response to the positive bias on the gate. In this case, the n-type silicon MOS-C and the conventional capacitor structure behave almost identically. Furthermore, this bias condition is known as the "accumulation" mode because it causes majority carriers to accumulate at the semiconductor surface. Thus, the "accumulation" mode occurs when a positive bias is applied ($V_{AB}>0$).

When a positive gate bias is applied to the MOS-C of FIG. 4b, a positive gate potential produces a positive charge on the gate, and a negative charge must arise in the substrate to balance the gate charge. In this case, there are very few mobile negative charge carriers (electrons) in the p-substrate. Thus, their scarcity prevents them from supplying enough of the required negative charge, especially at small positive gate-bias values. Instead, the repulsion of holes (the majority carriers) by the positive bias drives the holes away from the substrate-dielectric interface. This forms a region depleted of mobile carriers (i.e., a depletion region) that penetrates from the surface into the substrate. The departure of holes from this surface region leaves it negatively charged because the immobile, ionized acceptor impurities remain within the region. This negative "background" charge thus becomes the negative charge induced by the positive gate potential. As a result, the electric field lines terminate on these negative charges. Unlike in the case of accumulation, however, the terminal charge of the MOS-C in the semiconductor is no longer confined to the substrate-dielectric interface (i.e., to the Si surface). Instead, the charge is spread over some distance extending to the depth of the depletion region. This added distance increases the "effective" dielectric thickness and thus decreases the capacitance of the structure. Thus, unlike a conventional capacitor, whose capacitance is constant regardless of the applied bias, the capacitance of the MOSC varies with the applied bias under some bias conditions.

Note, however, that if the value of the positive gate bias becomes sufficiently large, a large number of minority carrier electrons will be attracted to the surface. They will collect there and come to dominate the negative charge in the substrate. This induced charge due to the electrons at the surface is called an inversion layer. Thus, the "inversion" mode occurs when a sufficiently high positive bias is applied ($V_{BA}>0$). This points out the fact that MOS-Cs indeed behave in a different fashion than conventional capacitor structures, and the importance of the bias vs capacitance relationship to insure that a desired value of capacitance is actually obtained.

Figure 6:
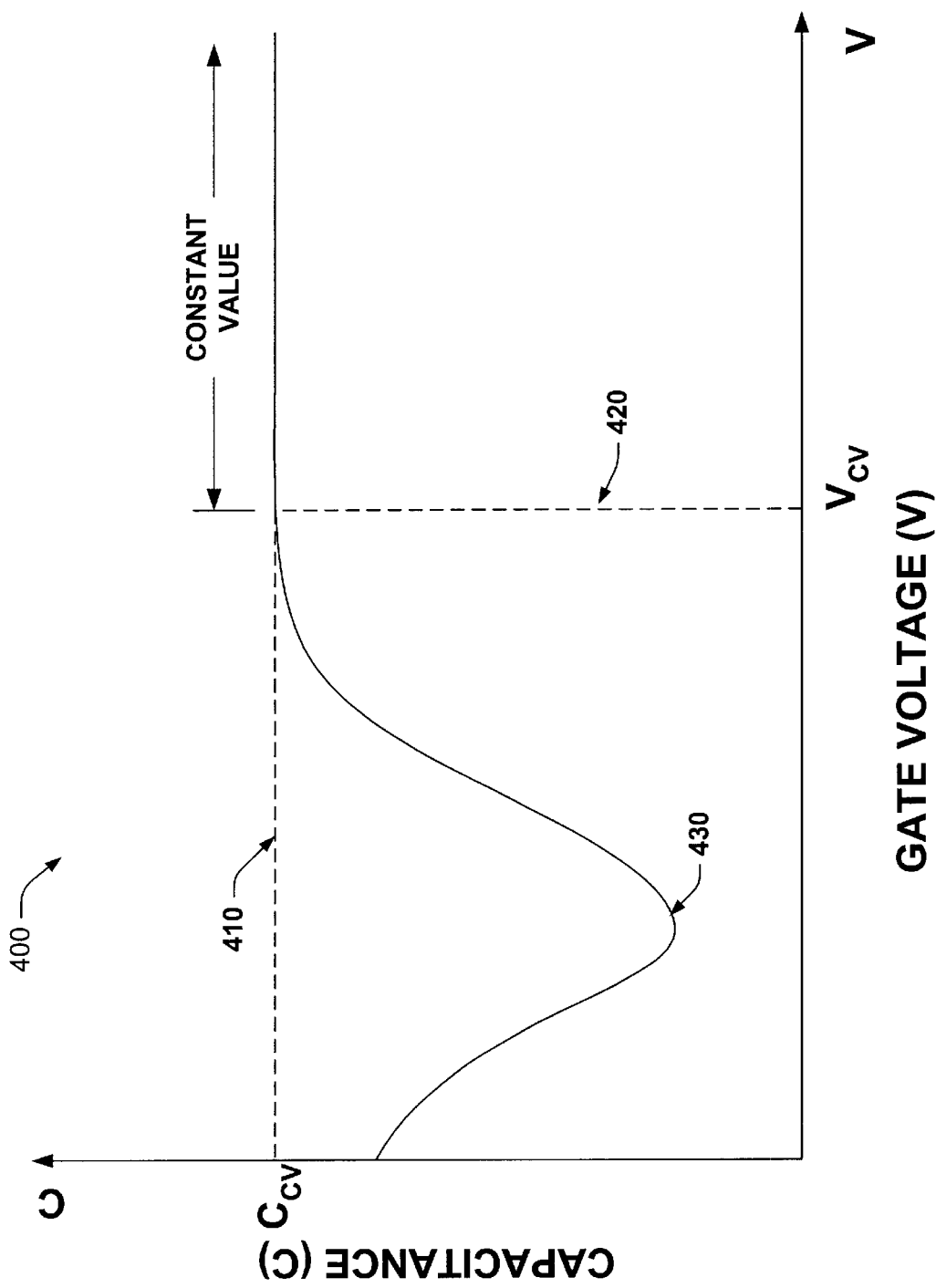
FIG. 6 is a plot of the capacitance vs gate voltage relationship of a MOS capacitor in accordance with an aspect of the invention.

FIG. 6 is a plot 400 of the relationship between capacitance and gate bias voltage of a MOS capacitor (300 in FIG. 4) as described above, and in accordance with an aspect of the invention. As was discussed, the capacitance of the MOS-C varies as a function of the applied bias voltage $V_{AB}$. Whether the accumulation mode condition or the inversion mode condition is used, it will be clear that the bias applied to the MOS-C should strive to avoid the "depletion" area ($V_{AB}\approx 0$) 430 where the MOS-C has a highly variable capacitance value. Rather, some voltage $V_{CV}$ 420 is selected, above which the capacitance $C_{CV}$ 410 has a relatively a constant value. Conversely, to obtain this relatively constant capacitance value, a bias circuit mechanism of supplying this voltage will have to be provided.

Figure 7:
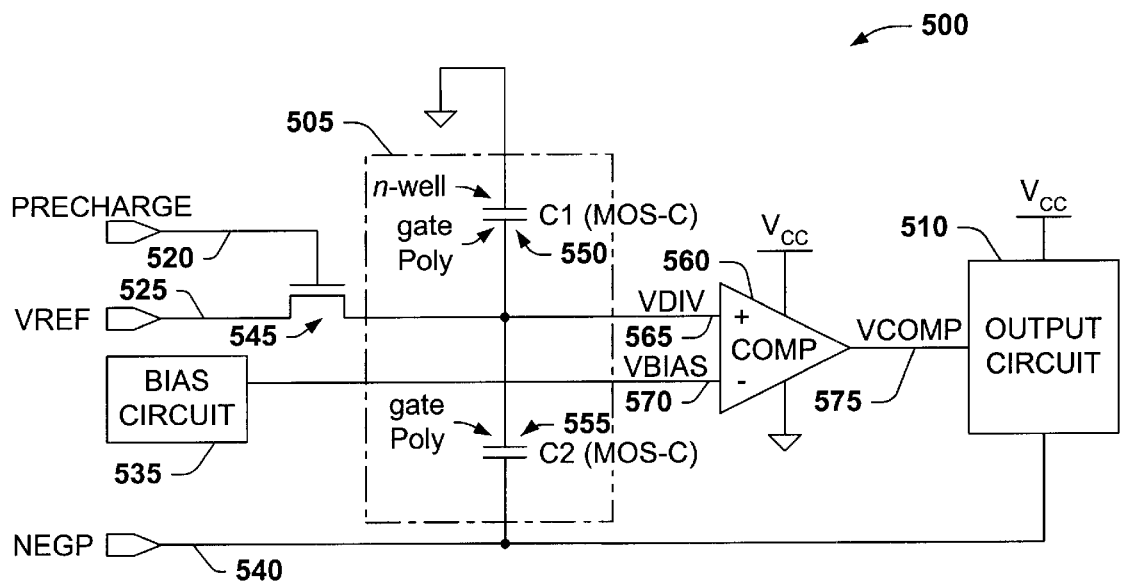
FIG. 7 is a simplified schematic illustration of an exemplary negative regulator circuit for a charge pump, wherein MOS capacitors and a bias circuit are used, in which various aspect the invention may be carried out.

FIG. 7 illustrates a simplified schematic of an exemplary negative regulator circuit 500 for a charge pump, wherein a MOS capacitor and a bias circuit are used, in which various aspects of the invention may be carried out. The present invention of a negative charge pump regulator 500 regulates the output NEGP 540 of a negative charge pump. The output of the charge pump is divided down across a poly-oxide-substrate (MOS-C) capacitor voltage divider comprising C1 (550) and C2 (555) to produce a voltage divider voltage VDIV. VDIV 565 is compared to a bias voltage VBIAS 570 (e.g., about ½ to ⅔ of VREF) as produced by a bias circuit 535 which is used in association with the MOS capacitors to insure they operate above a bias voltage which will maintain a minimum target capacitance within the voltage divider and result in a stable target regulation voltage. The comparison is made by a differential amplifier comparator 560 to yield a comparison result VCOMP 575, which is buffered by an output circuit 510 as feedback to the negative charge pump output 540. When the charge pump output tries to go lower than some target regulation voltage, the regulator output circuit 510 turns-on to pull the negative charge pump output voltage NEGP 540 up toward the supply voltage (this condition may be defined as "source loading"). When the charge pump output goes higher than the target regulation voltage, the output circuit 510 will turn-off to allow the negative charge pump output to continue down to a lower voltage.

The negative charge pump regulator 500 of the present invention also has a VREF input 525 and a PRECHARGE transistor 545 with a gate input 520, provided for initializing (precharging) the MOS capacitors in the voltage divider to a predetermined value VREF 525 (e.g., about 1.3 volts). Unlike a resistor voltage divider which has a continuous DC current for self biasing, a capacitor divider must be initialized or precharged to a predetermined initial voltage so the voltage divider can function properly.

In operation, the negative pump regulator 500, will initialize the capacitive divider by precharging C1 (550) and C2 (555) thru transistor 545 to the voltage at VREF 525, thus applying VREF across each of the MOS capacitors, as the NEGP output 540 of the charge pump 535 is also initialized at ground potential.

After the precharge interval, the charge pump is enabled and will begin to charge. The negative regulator 500, will begin regulating the output voltage at NEGP 540 when the voltage at the VDIV 565 non-inverting terminal has been pulled down to about the same voltage as VBIAS (e.g., about VREF/2, or ½ to ⅔ of VREF) which is on the inverting terminal 570 of the comparator. Note that at this point of regulation, that: the voltage across C1 is about;

$V_{C1} = VDIV \approx$ ½ to ⅔ of $VREF \approx$ ½ to ⅔ (~1.3 volts)≈0.65 V to 0.87 V. while the voltage across C2 is:

$V_{C2} = NEGP - DIV = NEGP - $(½ to ⅔ of $VREF$)

Viewed from a charge conservation standpoint, the regulated output voltage NEGP is: Total charge at initialization=Total charge during regulation, so $VREF*C1 + VREF*C2 = (VREF/2)*C1 + (VREF/2)*C2 - NEGP*C2 = \rightarrow NEGP = -(VREF/2)*(1+C1/C2)$ If $VREF/2 = 0.65$ V., and the ratio C1/C2 is about 8/1, then, $$NEGP=-(VREF/2)*(1+C1/C2)$$

$$NEGP=-(0.65)*(1+8)=-0.65*9$$

$$NEGP=-5.85 \text{ Volts}$$

Typically, as indicated in the example values above, C1 will be much larger than C2, in order to have a large divider ratio, thereby gaining a much higher output voltage than the applied VREF (e.g., about 1.3 volts).

It should be noted about the polarity of the MOS capacitor C1 (340 FIG. 4b) that its n-well connection terminal is held at ground, while the gate terminal is at the more positive potential VDIV 565 node. This produces a positive bias within the n-well, but an overall negative bias polarity condition for C1 which means that C1 is operating in the "accumulation" mode as discussed earlier.

The MOS capacitor C2 (300 FIG. 4a), as with C1, has its gate terminal at the more positive potential VDIV 565 node, however, the substrate S terminal of C2 is connected to the more negative NEGP output 540. This produces a positive bias polarity condition for C2 which means that C2 is operating in the "inversion" mode as discussed earlier. It should be noted that C2 in FIG. 7 was actually made from a triple-well MOS transistor with the source and drain terminal shorted together. Here, the source and drain terminals connect to the p-substrate in the same way as FIG. 4a 300, acting as one plate of the MOS-C, and the gate terminal as the other plate.

Figure 8:
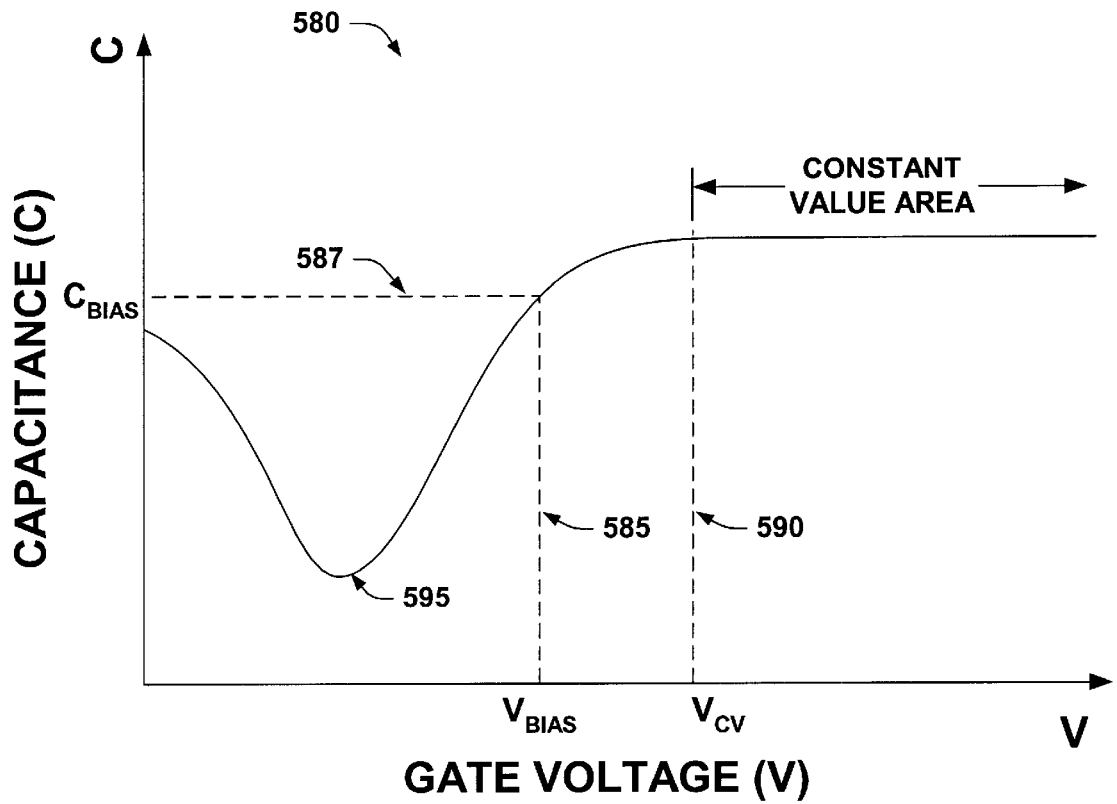
FIG. 8 is a plot of the capacitance vs gate voltage relationship of a MOS capacitor together with a target bias voltage set point in accordance with an aspect of the invention.

FIG. 8 is a plot 580 of the capacitance vs gate voltage relationship of a MOS capacitor together with a target bias voltage set point in accordance with an aspect of the invention. As in the circuit of FIG. 7 of the present invention, a bias circuit 535 is used in association with the MOS capacitors C1 (550) and C2 (555) to insure they operate above a bias voltage $V_{BIAS}$ 585 which will maintain a minimum target capacitance CBIAS 587 within the voltage divider and result in a Again, whether the accumulation mode condition or the inversion mode condition is used, the highly variable "depletion" area ($V_{AB} \approx 0$) 595 should be avoided. By comparison, certainly the more constant bias voltage $V_{CV}$ 590 could be selected which would yield a more constant capacitance, however, the particular regulator application may not require this high level of constant capacitance control from the bias circuit. Therefore, some actual minimum required level of capacitance is indicated by $C_{BIAS}$ 587 and an associated bias circuit voltage $V_{BIAS}$ 585 which is provided to the comparators inverting input 570.

Note in FIG. 7 that the voltage VBIAS 570 generated by the bias circuit 535 is not actually applied directly to the MOS-Cs, but a voltage equal to VBIAS is applied indirectly to the MOS-Cs via the VDIV node 565 during regulation. By contrast, this reference input could be set to zero volts with the conventional metal capacitors, because the metal capacitors do not require a bias voltage. Also, C1 must have more capacitance when operated at VREF/2 as compared with operation at zero volts, to maintain the same CV ratio of the two capacitors C1 and C2.

Figure 9:
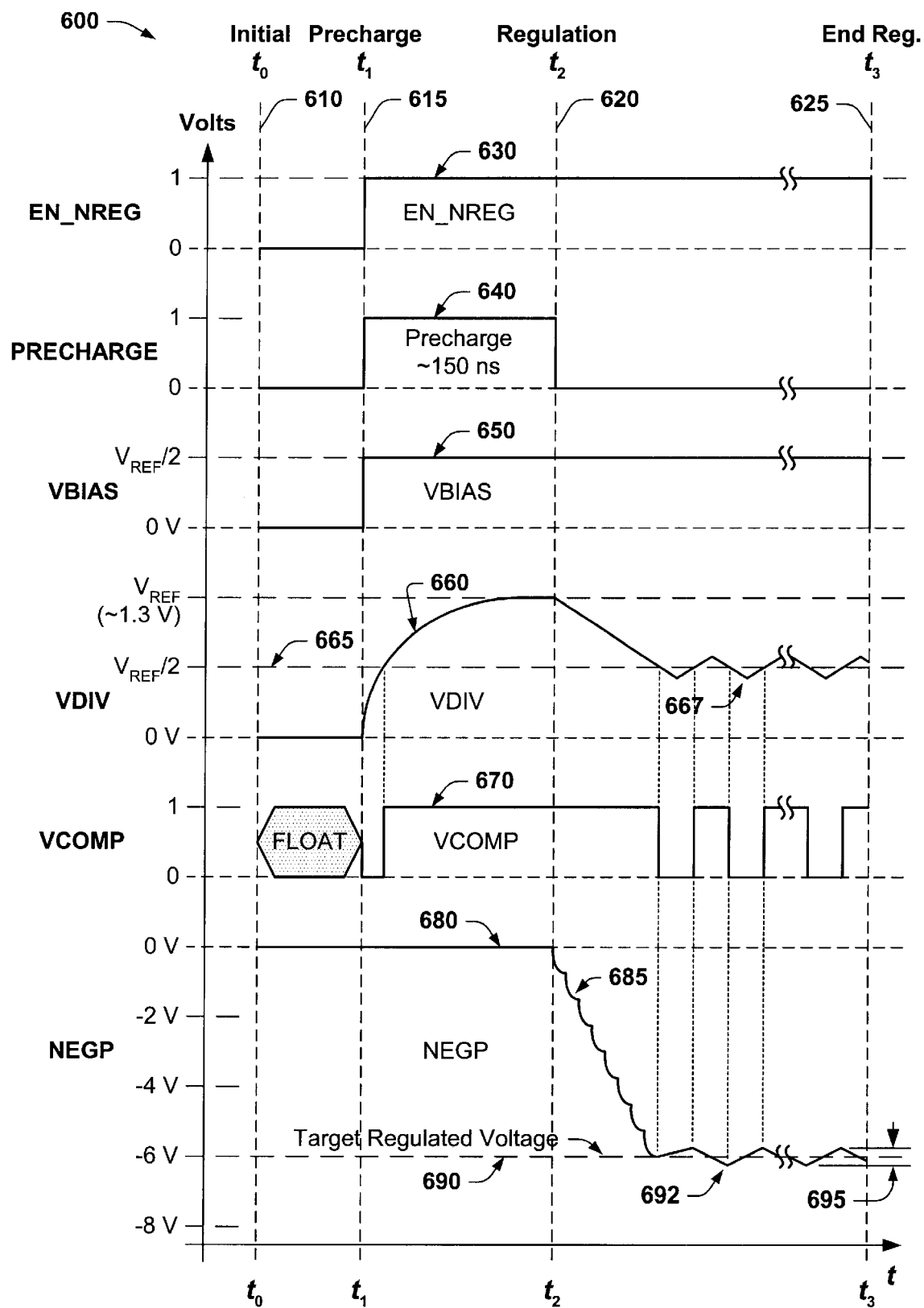
FIG. 9 is a simplified timing diagram illustrating exemplary negative regulator circuit mode timings and the output of the negative charge pump regulator in which various aspects of the invention may be carried out.

FIG. 9 is a simplified timing diagram 600 illustrating exemplary negative regulator circuit mode timings employed to produce the output (NEGP 540 of FIG. 7) of the negative charge pump regulator (500 of FIG. 7) in which various aspects of the invention may be carried out. For the following timing discussion of FIG. 9, refer to the exemplary negative regulator circuit of FIG. 7.

The initial conditions of the timing diagram are illustrated by timing $t_0$ 610. At $t_1$ 615, the timing sequence begins with an exemplary negative regulator enable timing EN_NREG 630. The PRECHARGE timing (e.g., about 150 ns) 640, produces an initialization signal PRECHARGE 520 to the gate of transistor 545 to conduct the reference voltage VREF 525 (e.g., about 1.3 volts) to the MOS capacitors C1 550, and C2 555. As both sides of C1 and C2 were initially at zero volts, C1 and C2 begin being precharged, as shown by the capacitor divider timing of VDIV and the circuit node 565, toward VREF. Also at $t_1$ 615, the Bias circuit 535 applies a bias voltage VBIAS (570, 650) (e.g., VREF/2, or ½ to ⅔ of VREF) to the inverting input of a differential comparator 560. The timing diagram of VDIV shows that as VDIV 660 charges and passes VREF/2 (665), the VCOMP output (575, 670) of the comparator 560 changes state from 0 to 1, as VDIV 660 increases above the reference input VBIAS (570, 650).

After both of the capacitors of the MOS capacitor divider have been precharged to VREF, regulation begins at timing $t_2$ 620, with the end of the PRECHARGE signal (520, 640). The negative charge pump output NEGP 540 now begins to pump from zero volts 680, along curve segment 685 until a target regulation voltage 690 has been reached. At the target regulation voltage 690 (e.g., 6 volts), the voltage at VDIV 667 becomes less than the reference voltage VBIAS (570, 650) produced by the bias circuit 535, resulting in the VCOMP output (575, 670) of the comparator 560 to change state from 1 back to 0. When VCOMP goes low, the output stage 510 turns-on to pull the negative pump output NEGP 540 toward $V_{CC}$ thereby increasing NEGP again.

Continued regulation of the negative charge pump is perpetuated when the output stage 510 causes the NEGP output to rise sufficiently toward VCC, such that the comparator detects the voltage at VDIV 667 is greater than the reference voltage VBIAS (570, 650), and results in the VCOMP output (575, 670) of the comparator 560 changing state from 0 back to 1. When VCOMP goes high, the output circuit 510 turns-off again, allowing the negative charge pump to once again pump the NEGP output voltage lower again. In this way, the output circuit 510 and NEGP output 540 are fed back to the MOS capacitor voltage divider via a VDIV node voltage 667, to affect a regulation of the negative charge pump output voltage NEGP along 692. The negative charge pump regulation operation ends at timing $t_3$ 625. An exemplary regulation hysteresis is illustrated by 695 with a peak-to-peak response (e.g.,±0.1 volt).

Figure 10:
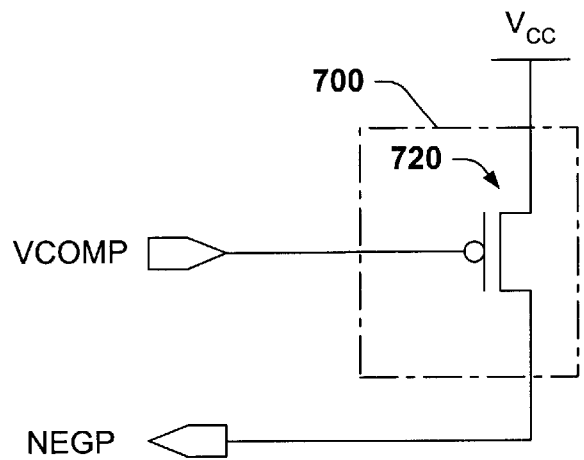
FIG. 10 is a simplified schematic illustration of an exemplary p-channel transistor output circuit, in accordance with an aspect of the invention.

FIG. 10 is a simplified schematic illustration of an exemplary p-channel transistor output circuit 700, in accordance with an aspect of the invention. VCOMP is the logic output of the comparator (575 and 560 respectively in FIG. 7) which is fed to the gate of a p-channel transistor 720, with a drain terminal connected to $V_{CC}$, and a source terminal coupled to NEGP, the output of the negative charge pump (540 of FIG. 7). The exemplary output circuit provides feedback to the MOS-C's and to the negative charge pump.

Figure 11:
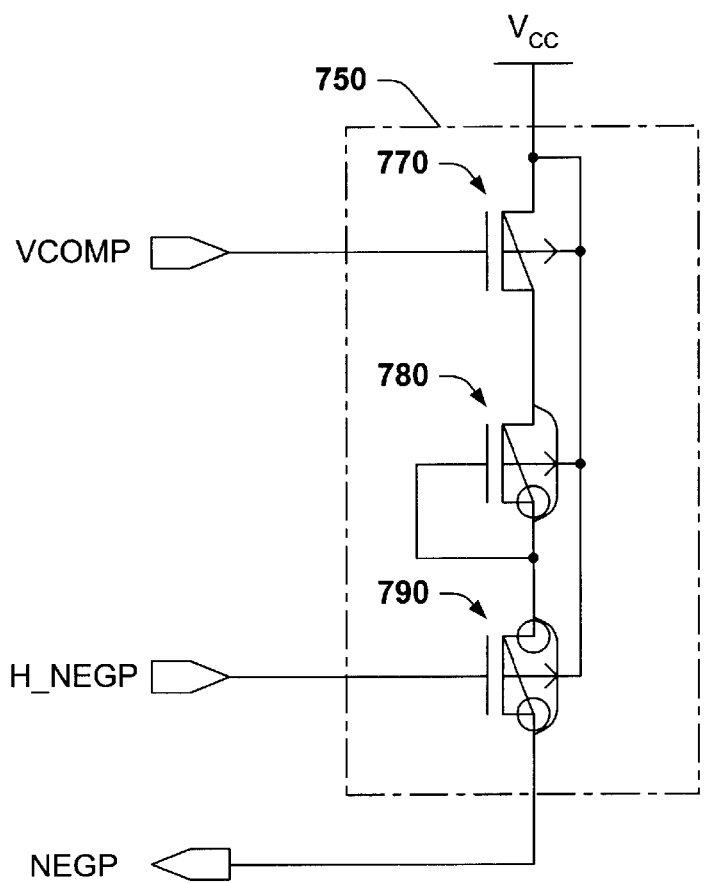
FIG. 11 is a detailed schematic illustration of an exemplary output circuit comprising a p-channel transistor network, in accordance with an aspect of the invention.

FIG. 11 is a detailed schematic illustration of another exemplary output circuit 750 comprising a p-channel transistor network, in accordance with an aspect of the invention. Again, VCOMP is the logic output of the comparator (575 and 560 respectively in FIG. 7) which is fed to the gate of a p-channel transistor 770, with a drain terminal connected to $V_{CC}$, and a source terminal coupled to a diode-connected transistor 780 coupled to a p-channel output transistor 790 coupled to NEGP, the output of the negative charge pump (540 of FIG. 7). The half-negative input H_NEGP has an absolute value which is about half the absolute value at the NEGP node. For example, if NEGP is −6 volts, then H_NEGP is about −3 volts. The purpose of the output circuit transistors 780 and 790, and the H_NEGP input, is to prevent the "hot-switching" condition of transistor 770 when its $V_{DS}$ is larger than some specified value at the time the transistor is switched on or off. The exemplary output circuit 750 also provides feedback to the MOS-C's and to the negative charge pump.

Figure 12:
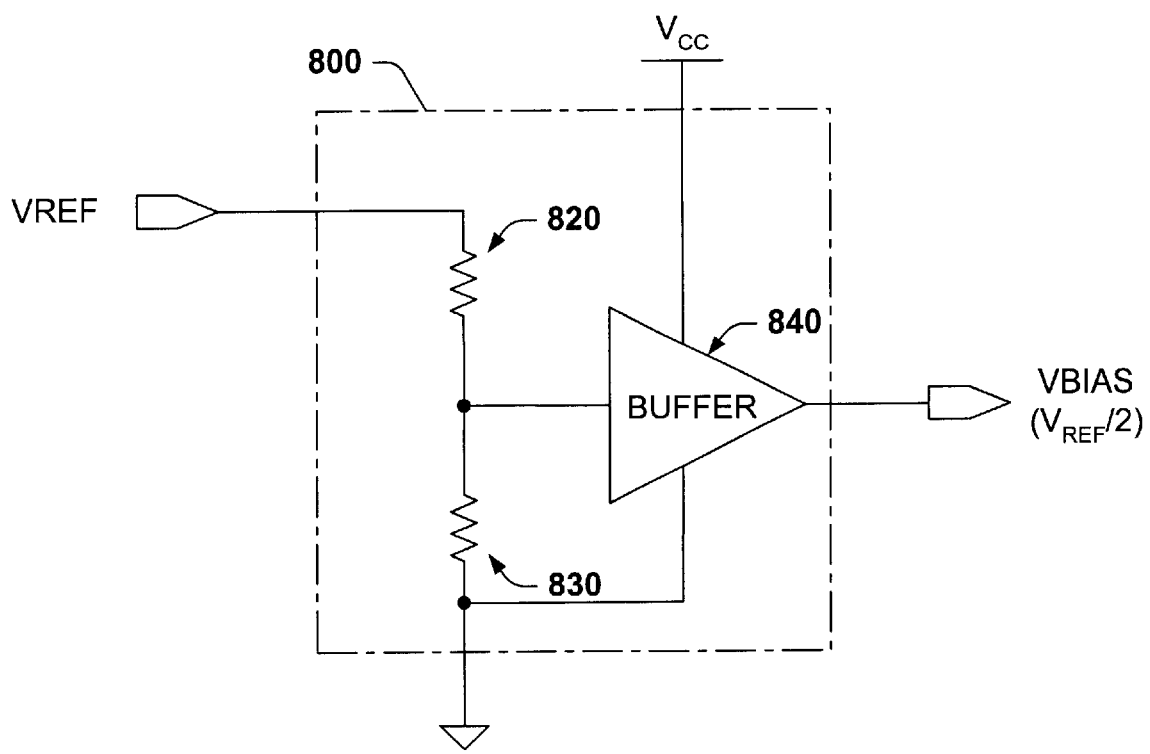
FIG. 12 is a simplified schematic illustration of an exemplary bias circuit comprising a resistor voltage divider with output buffer, in accordance with an aspect of the invention.

FIG. 12 is a simplified schematic illustration of an exemplary bias circuit 800 comprising a resistor voltage divider (820 and 830) with an output buffer 840, in accordance with an aspect of the invention. This exemplary bias circuit 800 receives an input reference voltage (e.g., VREF, about 1.3 volts), and divides this voltage down to a lower reference voltage (e.g., ½ to ⅔ VREF, about 0.65 to 0.87 volts), and buffers this output to produce a bias voltage VBIAS (e.g., VREF/2) which is used in association with an equivalent voltage to bias MOS capacitors within a capacitor voltage divider for a negative regulator circuit for a negative charge pump.

Figure 13:
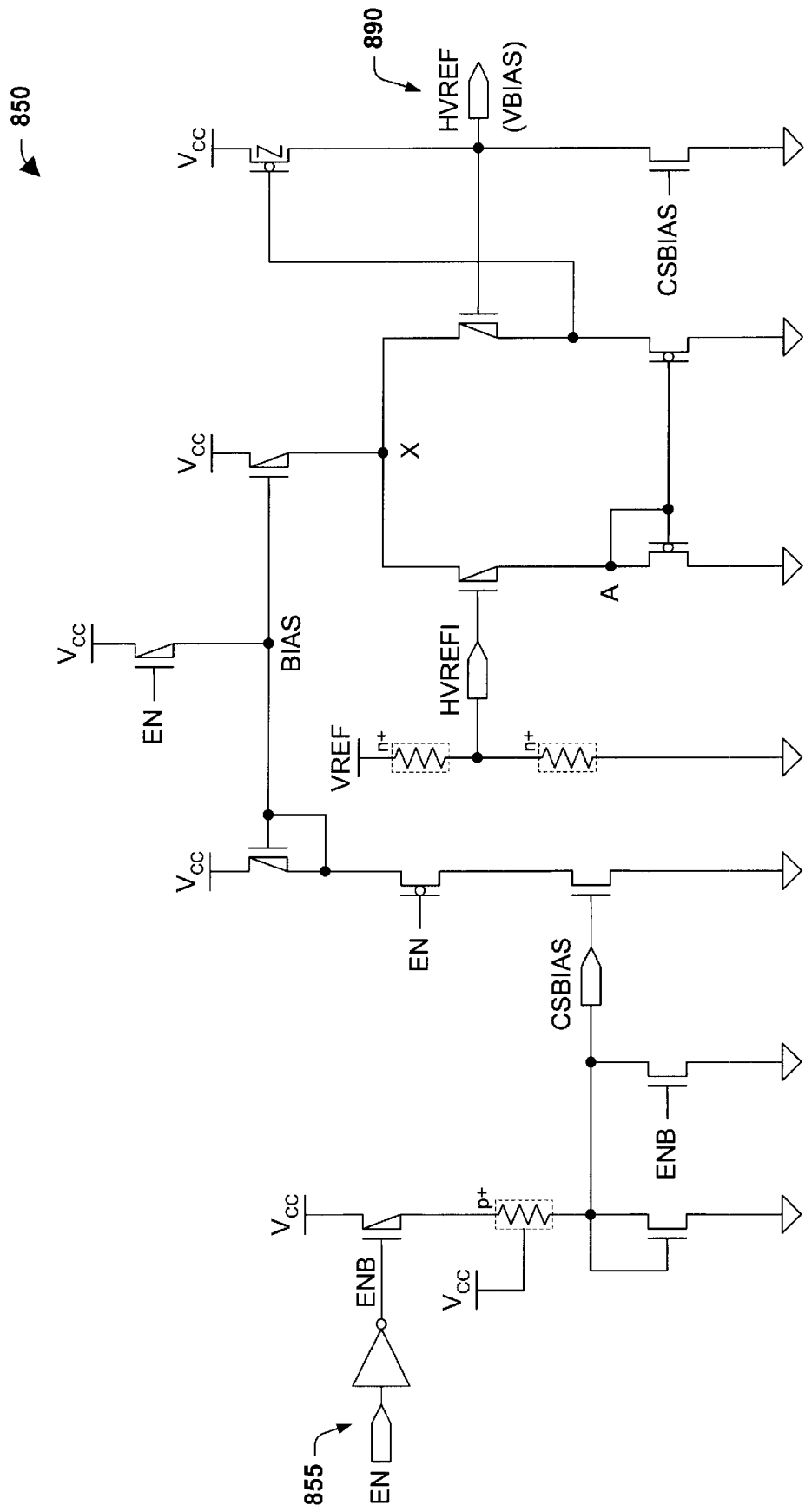
FIG. 13 is a detailed schematic illustration of an exemplary bias circuit comprising a resistor divider with a MOS transistor output buffer, in accordance with an aspect of the invention.

FIG. 13 is a detailed schematic illustration of another exemplary bias circuit 850 with a MOS transistor output buffer for producing a bias voltage of about half the VREF voltage HVREF 890, in accordance with an aspect of the invention. This exemplary bias circuit 850 receives an input reference voltage (e.g., VREF, about 1.3 volts), and divides this voltage down to a lower reference voltage (e.g., ½ to ⅔ VREF, about 0.65 to 0.87 volts), and buffers this output to produce a bias voltage VBIAS (e.g., VREF/2) which is used in association with an equivalent voltage to bias MOS capacitors within a capacitor voltage divider for a negative regulator circuit for a negative charge pump. Other variations of the exemplary bias circuit are contemplated as falling within the scope of the present invention, whereby a bias voltage may be generated to bias MOS capacitors.

Figure 14:
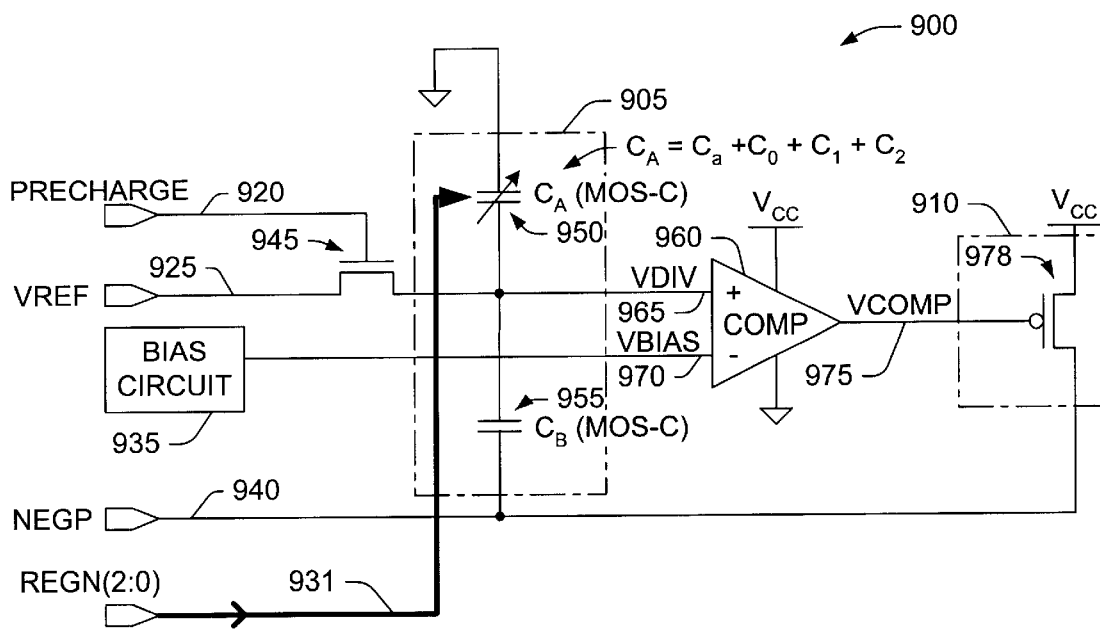
FIG. 14 is a simplified schematic illustration of an exemplary negative regulator circuit for a charge pump, wherein MOS capacitors and a bias circuit are used, together with a control signal input and an associated capacitance selection mechanism, in accordance with another aspect of the invention.
Figure 15:
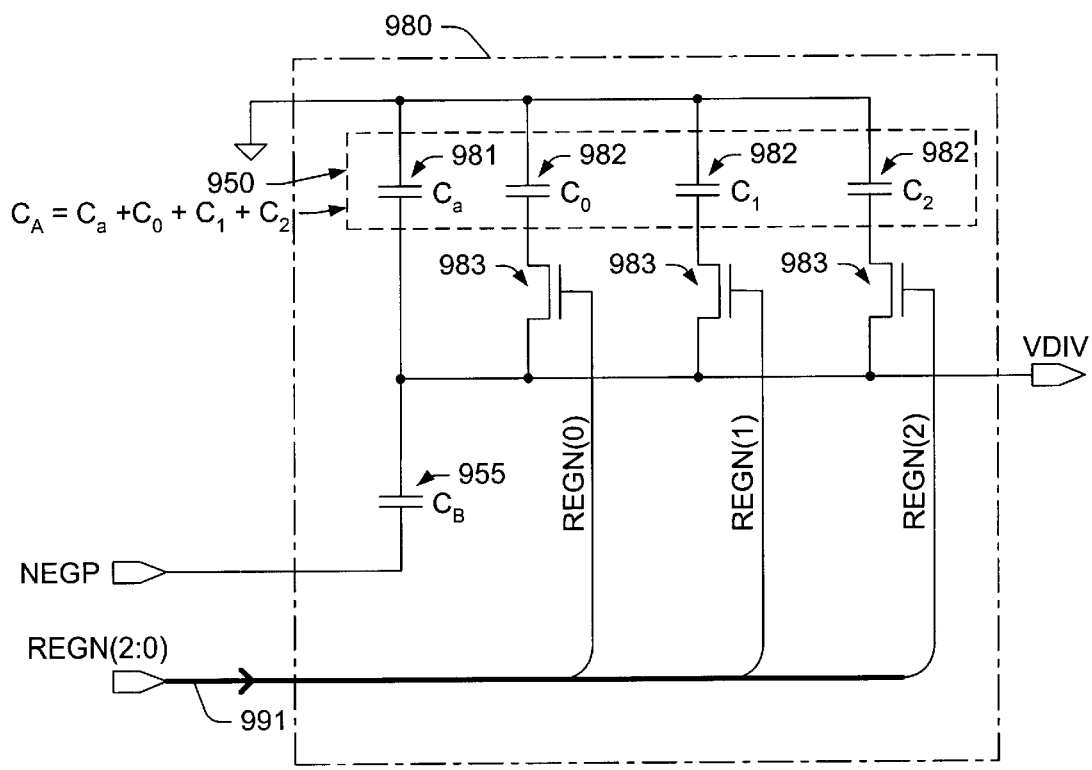
FIG. 15 is a schematic illustration of an exemplary capacitance selection circuit, in accordance with another aspect of the invention.

FIG. 14 is a simplified schematic illustration of an exemplary negative regulator circuit 900 for a charge pump, wherein MOS capacitors and a bias circuit are used, together with a control signal input 931 and an associated capacitance selection mechanism, in accordance with another aspect of the invention. The present invention of a negative charge pump regulator 900 regulates the output NEGP 940 of a negative charge pump. The output of the charge pump is divided down across a poly-oxide-substrate (MOS-C) capacitor voltage divider comprising $C_A$ (950) and $C_B$ (955) to produce a voltage divider voltage VDIV. The MOS-C capacitor $C_A$ (950) in the voltage divider is an effective capacitance value $C_A$ comprising a plurality of selective MOS capacitors where:

$$C_A = Ca + C_0 + C_{1+C2} \ldots C_N$$

wherein, Ca is a fixed capacitor which will set the minimum value obtainable, and $C_0$ thru $C_N$, are selective capacitances as shown in FIG. 15 with three exemplary selectable capacitors 982.

The purpose of the selectable capacitance value is, for example, for the ability to compensate for manufacturing tolerances of the MOS capacitors within the negative regulator voltage divider, to trim the voltage divider ratio, to change between various mode operations and associated voltages, or any other reason which requires selection of a new voltage divider ratio and an associated target regulation voltage.

Although FIG. 14 shows only $C_A$ being varied, it will be understood that either one or both of the capacitors of the voltage divider may be varied to accomplish a change in the voltage divider ratio.

The control signal input may be, for example, an exemplary multi-bit binary code 931 to select one or more MOS capacitors which in turn permit selection of a new voltage divider ratio and an associated target regulation voltage to be produced at NEGP 940 for the reasons mentioned above. The control signal is therefore used to selectively apply or remove capacitors to the effective capacitor $C_A$ to affect an appropriate capacitance change.

All other portions of this exemplary alternate negative pump regulation circuit with a selectable MOS capacitance mechanism is identical to the circuit of FIG. 7, so does not need to be described in detail again.

FIG. 15 is a schematic illustration of an exemplary MOS capacitance selection circuit 980, in accordance with another aspect of the invention. FIG. 15 illustrates more of the details of the capacitance selection mechanism applied to the circuit of FIG. 14. As described above, the output of the charge pump is divided down across a poly-oxide-nwell (MOS-C) capacitor voltage divider comprising $C_A$ (950) and $C_B$ (955) to produce a voltage divider voltage VDIV. The MOS-C capacitor $C_A$ (950) in the voltage divider is an effective capacitance value $C_A$ 950 comprising a plurality of selective MOS capacitors where:

$$C_A = Ca + C_0 + C_1 + C_2 \ldots C_N$$

wherein, Ca 981 is a fixed capacitor which will set the minimum value obtainable, and $C_0$ thru $C_N$, are selective capacitances as shown in FIG. 15 with three exemplary selectable capacitors 982.

A control signal input comprising, for example, an exemplary three bit binary code REGN(2:0) 991, maybe used to select one or more MOS capacitors 982 which provides a new voltage divider ratio and an associated voltage divider voltage VDIV. The control signal REGN(2:0) 991 may be comprised of, for example, individual bits of a control word which may be applied to, for example, the gate of a capacitor selection transistor 983, which selects a combination of MOS capacitors 982. The control signal 991 is therefore used to selectively apply or remove capacitors to the effective capacitor $C_A$ to affect an appropriate voltage divider ratio change such that a target regulation voltage may be chosen within the associated limits of the selectable MOS capacitors used.

A regulator circuit is used to regulate the output voltage of a charge pump to thereby generate regulated wordline voltages during various flash memory cell modes. Capacitor voltage dividers are used typically in the regulator circuit of a charge pump because, by comparison to other voltage dividers, they require the least power and yet make a simple regulator system. The conventional metal capacitor, however, must be made of a relatively thick dielectric layer. Because of this thick dielectric, conventional metal capacitors must be large for a given value, requiring a large area of the semiconductor. The increasing use of small, portable, low power devices illustrates the need for reducing the area required for a negative regulator used in conjunction with a negative charge pump circuit, while maintaining a low power and simple regulator design.

On the other hand, MOS capacitors have the benefit of a very thin (≈160 Å) $SiO_2$ dielectric insulating layer which permits approximately 10 times the capacitance per unit area of that of the conventional metal capacitor. A voltage divider comprising MOS capacitors used in conjunction with a bias circuit to insure the capacitance on the MOS capacitors does not fall below a predetermined minimum value, will still only occupy approximately ⅙ the area of the conventional metal capacitor voltage divider.

Consequently, the present invention provides a negative regulator circuit for a charge pump, employing a voltage divider comprising one or more MOS capacitors used in association with a bias circuit to insure the MOS capacitors operate above a bias voltage which will maintain a minimum target capacitance within the voltage divider, which requires less area than conventional negative charge pump regulator circuits, while maintaining a low power and simple regulator design.

In an aspect of the present invention, the bias circuit 535 produces a bias voltage which is used as a reference voltage by the differential comparator circuit 560, which is compared to the MOS-C voltage divider 505 in such a way that the feedback of the regulator circuit causes the voltage divider to produce a voltage equivalent to the bias voltage on the VDIV node 565 to the comparator and across the MOS capacitors. Thus, indirectly, the MOS capacitors also retain, as a minimum, the desired VBIAS node 570 voltage to maintain a minimum target capacitance.

Another advantage of the present invention is the ability of the negative regulator system to produce a more accurate voltage divider output, than a conventional MOS capacitor voltage divider system without the bias voltage. The bias circuit voltage prevents widely varying divider ratios within the capacitor voltage divider and the resulting widely varying regulation output voltages which would be experienced.

In another exemplary aspect of the invention, the negative regulator also contains an initialization circuit which precharges the voltage divider MOS capacitors to a reference voltage VREF (e.g., about 1.3 volts). This precharge voltage is placed across the capacitors because, unlike resistor voltage dividers, there is no dc bias current which flows thru the capacitors to establish an appropriate divider voltage. Yet, as was developed earlier, the MOS capacitors will equally charge share during regulation such that a voltage divider ratio is established proportionate to the capacitance ratio between C1 and C2.

According to an exemplary aspect of the present invention, the system incorporates a capacitance selection circuit which is used to select a combination of MOS capacitors in a capacitor voltage divider, or to vary the effective capacitance of one or both of the divider capacitors, effecting a divider ratio change, to chose a target voltage divider ratio, or a target regulated output voltage. Manufacturing capacitance variations, for example, may be compensated, enabling a more accurate output voltage, for example, wordline voltage. Further, a capacitance selection circuit permits changing the regulated output voltage.

In another aspect of the invention, the selective MOS capacitor circuit elements may be any combination of circuit architecture which exhibits capacitance (e.g., transistor junction, or capacitors) which are operable to be varied by the sense and control circuit.

It is thus seen that appropriate voltages may be applied to the various terminals (e.g., gate) of the cells in the memory device in order to perform various operations (e.g., erase) associated with the device. However, as stated above, the conventional negative regulators and charge pumps used to produce those applied voltages have heretofore used much larger metal capacitors in the voltage divider of the regulator. MOS capacitors can be made with a dielectric layer which is much thinner than conventional metal capacitors, and employed in the capacitive voltage divider of a negative regulator, thereby substantially reducing the area required for the regulator, yielding a smaller device, and the end product.

The system 500 therefore detects the output voltage value of the negative charge pump at NEGP, and switches the output circuit to source the supply voltage (e.g., $V_{CC}$) to the negative charge pump output to regulate the output voltage with a negative regulator circuit, wherein the regulator uses MOS capacitors to conserve space, and a bias circuit to maintain a bias voltage on the MOS capacitors, wherein the bias voltage insures a minimum predetermined capacitance on the MOS capacitors, to produce a regulated output voltage which may be applied to core cells during various operations of flash memory arrays. Accordingly, the system 500 is operable to dynamically regulate the output of the charge pump, whereby regulation of a negative charge pump is accomplished employing MOS capacitors in the voltage divider and a MOS capacitor bias voltage to create a charge pump regulator circuit which requires less area than conventional negative charge pump regulator circuits, while maintaining a low power and simple regulator design.

Optionally, the system 900 provides for selection of the MOS capacitors of the negative regulator capacitance voltage divider, in which a capacitance selection circuit is used to select a combination of MOS capacitors, which are operable to vary a capacitor voltage divider ratio, to provide a selectable target regulated output voltage in a reduced area regulator for a negative charge pump.

Figure 16:
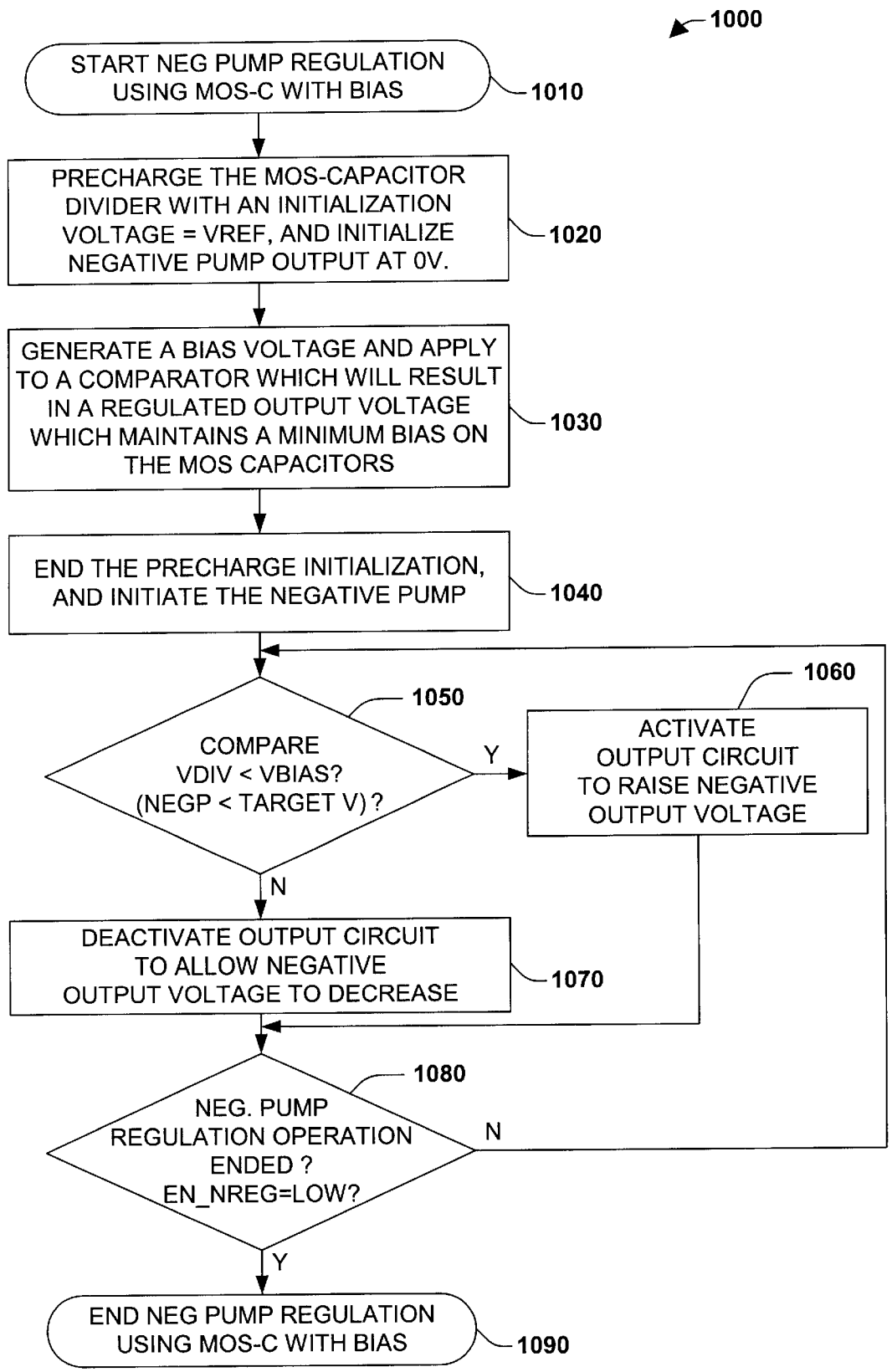
FIG. 16 is a flow diagram illustrating an exemplary method for a negative charge pump regulator operation in association with an aspect of the present invention.

Another aspect of the present invention provides a methodology for regulation of the negative charge pump operation in a memory device, which may be employed in association with the memory devices illustrated and described herein, as well as with other memory devices. Referring now to FIG. 16, an exemplary method 1000 is illustrated for a negative charge pump regulator operation in a memory device in association with an aspect of the present invention. While the exemplary method 1000 is illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the method 1000 may be implemented in association with the apparatus and systems illustrated and described herein as well as in association with other systems not illustrated.

The method 1000 comprises initializing by precharging the MOS capacitors of a voltage divider circuit, generating a bias voltage to a comparator which will result in a regulated output feedback voltage which maintains a minimum bias voltage to insure a minimum capacitance value on the MOS capacitors, determining the level difference of the voltage divider relative to the bias voltage and regulating the negative charge pump output voltage accordingly to a target regulation value, and determining whether the regulation operation has ended based upon an enable signal, in order to reduce the area required for a negative regulator used in conjunction with a negative charge pump circuit, while maintaining a low power and simple regulator design.

The regulated negative charge pump operation method begins at step 1010. At 1020 a reference voltage VREF (e.g., about 1.3 volts) is used to precharge the MOS capacitors of a voltage divider circuit, and a negative charge pump output is initialized at zero volts. At 1030, the bias circuit generates a bias voltage VBIAS (e.g. about ½ to ⅔ REF) which is applied to a comparator which will in turn result in a regulated ou and feedback voltage being applied to the voltage divider which maintains a minimum bias on the MOS capacitors associated with the bias circuit bias voltage. The precharge initialization timing ends at 1040 and the negative charge pumping is initiated. The determination is then made at step 1050, whether the voltage at the voltage divider is less than the bias voltage, in order to determine if the negative charge pump output voltage is less than a target regulation value.

Thereafter a regulated negative charge pump output voltage NEGP resulting from the regulation of the negative charge pump is produced for various memory operations, with a reduced area negative regulator used in conjunction with a negative charge pump circuit, while maintaining a low power and simple regulator design. At step 1080, a determination may be made whether the regulated negative charge pump operation is still enabled. If the operation is still enabled, the regulated negative charge pump operation continues at 1050, otherwise the operation thereafter ends at 1090, and the method 1000 maybe repeated for subsequent regulated negative charge pump operations of the memory device.

Optionally, the method 1000 may be expanded to include the capacitance selection circuit operations, for example, as illustrated in FIGS. 14 and 15 as a variant of the method 1000. The method 1000 would then include an optional set of steps for making a selection of one or more of the selectable capacitors (e.g., 982 of FIG. 15) which would occur on or before step 1020 to insure the selected capacitors receive the initialization precharge. As discussed, either $C_A$, $C_B$, or both $C_A$ and $C_B$ may comprise selectable MOS capacitors, thereby providing a mechanism of selectable capacitance value, for example, the ability to compensate for manufacturing tolerances of the MOS capacitors, to select various mode operations, to trim the voltage divider ratio, or any other reason which requires selection of a new voltage divider ratio and an associated target regulation voltage.

Thereafter a regulated negative charge pump output voltage NEGP resulting from the regulation of the negative charge pump is produced for various memory operations, with a reduced area negative regulator used in conjunction with a negative charge pump circuit, while maintaining a low power and simple regulator design.

The methodology 1000 thus provides for a reduced area negative charge pump regulator circuit for a negative charge pump, in which the regulator uses MOS capacitors to conserve space, and a bias circuit to maintain a bias voltage on the MOS capacitors, wherein the bias voltage insures a minimum predetermined capacitance on the MOS capacitors, to produce a regulated output voltage which may be applied to core cells during various operations of flash memory arrays. Other variants of methodologies may be provided in accordance with the present invention, whereby regulation of a negative charge pump is accomplished employing MOS capacitors in the voltage divider and a MOS capacitor bias voltage.

Although the invention has been shown and described with respect to one or more implementations, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A system for generating a regulated negative charge pump voltage for flash memory operations, comprising:

an initialization circuit configured to precharge the capacitors of a capacitive voltage divider with a reference voltage;

a capacitive voltage divider circuit comprising one or more MOS capacitors configured to respond to the regulated output voltage of a negative charge pump circuit and an output circuit loading and generate a voltage divider output signal associated therewith;

a bias circuit operable to generate a bias voltage which is used in association with the MOS capacitors to insure they operate above a bias voltage which will maintain a minimum target capacitance within the voltage divider, resulting in a stable target regulation voltage;

an output circuit operable to source the negative charge pump output voltage to a supply voltage; and a negative regulator control circuit operably coupled to the initialization circuit and the capacitive voltage divider circuit, and operable to receive the bias circuit voltage and the associated MOS capacitor voltage divider circuit output, and operable to receive a negative charge pump output voltage and regulate an output circuit loading via the supply voltage to produce a feedback to the negative charge pump circuit based on the target voltage value established by the MOS capacitor voltage divider, thereby creating a reduced area negative regulator used in conjunction with a negative charge pump circuit, which maintains a low power and simple regulator design.

2. The system of claim 1, wherein the initialization circuit comprises an n-channel transistor operable to receive a precharge timing signal and a reference voltage value as an input and to couple the reference voltage to the MOS capacitor voltage divider.

3. The system of claim 1, wherein the bias circuit comprises a resistor voltage divider and an output buffer operable to receive a reference input voltage, and operable to generate a bias voltage which is used in association with the MOS capacitors to insure they operate above a bias voltage which will maintain a minimum target capacitance within the voltage divider, resulting in a stable target regulation voltage.

4. The system of claim 1, wherein the output circuit comprises a p-channel transistor with a gate coupled to the negative regulator control circuit, a drain terminal coupled to a supply voltage, and a source terminal coupled to a negative charge pump output voltage, and operable to source the negative charge pump output voltage to the supply voltage.

5. The system of claim 1, wherein the one or more MOS capacitors comprises one or more polysilicon layers operable as capacitor plates.

6. The system of claim 1, wherein the capacitor voltage divider circuit comprises:

a capacitance selection circuit operable to receive one or more control signal inputs, which are operable to select one or more of a plurality of selection capacitors, thereby exhibiting a capacitance, thereby selecting the capacitive voltage divider circuit ratio and the associated regulated output voltage value; and a plurality of capacitor selection networks each having a first terminal coupled to a respective node of the capacitor voltage divider circuit, and each having a second terminal which is selectively coupleable to the capacitor voltage divider circuit output terminal based on the one or more control signal inputs, thereby causing one or more of the plurality of selection capacitor networks to exhibit a capacitance, thereby adjusting the capacitive voltage divider circuit ratio and the associated regulated output voltage value.

7. The system of claim 6, wherein the capacitance selection circuit comprises a selectively employable network of capacitors.

8. The system of claim 6, wherein the selection of the capacitive voltage divider circuit ratio, alters an effective network capacitance for one or more capacitors of the voltage divider.

9. The system of claim 1, wherein the bias circuit further comprises a reference voltage circuit operable to provide a bias reference voltage for comparing one or more voltages associated with the regulator output voltage value thereto, wherein the comparison of the bias voltage to the capacitive voltage divider output voltage associated with the regulator output voltage results in a regulated output voltage value associated with the capacitive voltage divider ratio and the reference voltage.

10. A method of generating a regulated negative charge pump voltage in a flash memory device which requires substantially less area, while maintaining a low power and simple regulator design, comprising the step of:

initializing a capacitive voltage divider by precharging the MOS capacitors of the divider with a reference voltage;

generating a capacitive voltage divider output voltage based on the precharge charge and the negative charge pump output voltage and applying the output voltage to a comparator of the regulation control circuit such that the regulated output voltage will maintain a minimum bias voltage on the MOS capacitors of the voltage divider, based on the feedback from the regulated output voltage;

generating a bias voltage and applying the bias voltage to a comparator of the regulation control circuit such that the regulated output voltage will maintain a minimum bias voltage on the MOS capacitors of the voltage divider;

terminating the precharge initialization step and initiating the negative charge pump circuit such that the negative charge pump begins pumping and the regulated output voltage charges toward a target regulation output voltage;

comparing the voltage divider output voltage to the bias circuit voltage;

generating a source loading condition on the negative charge pump, by switching an output circuit on or off to correspond with the comparison;

determining whether the regulation operation is still enabled; and continuing the negative regulation operation and repeating the voltage divider comparison steps if the operation is still enabled, otherwise, ending the negative regulation operation if the operation is not enabled, thereby regulating the charge pump output voltage in response to the negative charge pump output voltage value, employing a flash memory device which requires substantially less area, while maintaining a low power and simple regulator design.

11. The method of claim 10, wherein initializing a capacitive voltage divider by precharging the MOS capacitors of the divider with a reference voltage comprises:

inputting the reference voltage value into an n-channel MOS transistor;

inputting the PRECHARGE signal into the gate of the n-channel MOS transistor; and coupling the reference voltage to the capacitive voltage divider to precharge the MOS capacitors of the voltage divider.

12. The method of claim 10, wherein generating a capacitive voltage divider output voltage comprises:

inputting the reference voltage PRECHARGE to the MOS capacitors of the voltage divider; and inputting the negative charge pump output voltage to the voltage divider; and generating a voltage divider output voltage based upon the precharge and on the feedback from the regulated output voltage, such that the regulated output voltage will maintain a minimum bias voltage on the MOS capacitors of the voltage divider.

13. The method of claim 10, wherein generating a bias voltage from the bias circuit comprises:

inputting a reference voltage to a voltage divider within the bias circuit;

applying an output of the voltage divider to an output buffer; and generating a bias voltage from the voltage divider buffered output which is used in association with the MOS capacitors to insure they operate above a bias voltage which will maintain a minimum target capacitance within the voltage divider, resulting in a stable target regulation voltage.

14. The method of claim 10, wherein the generating a source loading condition on the negative charge pump comprises:

inputting a supply voltage as a source to the output circuit;

inputting a comparison result of the comparison between the MOS voltage divider output and the bias voltage to the output circuit; and switching the output circuit on or off to correspond with the comparison result, thereby coupling the supply voltage to the output of the negative charge pump, and generating the source loading condition on the negative charge pump based on the comparison result.

15. The method of claim 10, wherein the regulator for the negative charge pump comprises a MOS capacitive voltage divider having a plurality of MOS capacitor selection networks each having a first terminal coupled to a respective node of the capacitor voltage divider circuit, and each having a second terminal which is selectively coupleable to the capacitor voltage divider circuit output terminal based on one or more control signal inputs to the capacitor selection networks, thereby causing one or more of the plurality of selection capacitor networks to exhibit a capacitance, thereby adjusting the capacitive voltage divider circuit ratio and the associated regulated output voltage value, wherein the regulation operation comprises the additional steps of:

inputting one or more control signal inputs to the capacitor selection networks;

selectively switching on or off one or more of the capacitors of the plurality of capacitors selection networks, thereby adjusting the capacitive voltage divider circuit ratio based on the one or more control signal inputs;

initializing by precharging the MOS capacitors of the one or more of the plurality of selection capacitor networks of the divider with a reference voltage during the precharge timing; and continuing the negative regulation operation.

* * * * *

UNITED STATES PATENT AND TRADEMARK OFFICE
CERTIFICATE OF CORRECTION

PATENT NO. : 6,515,903 B1
DATED : February 4, 2003
INVENTOR(S) : Binh Q. Le and Pau-Ling Chen It is certified that error appears in the above-identified patent and that said Letters Patent is hereby corrected as shown below:

<u>Title page,</u>
Item [75], Inventors, please replace the second inventor's name "Pau-Lin Chen" with
-- Pau-Ling Chen --.

<u>Column 7,</u>
Line 48, please replace the word "ap-type" with the word -- a p-type --.

<u>Column 9,</u>
Line 45, please replace the word "MOSC" with the word -- MOS-C --.

<u>Column 10,</u>
Line 60, please replace the formula
"$V_{C2} = NEGP - DIV = NEGP - (1/2 \text{ to } 2/3 \text{ of VREF})$" with the formula:
-- $V_{C2} = NEGP - VDIV = NEGP - (1/2 \text{ to } 2/3 \text{ of VREF})$ --.

<u>Column 11,</u>
Line 36, please replace the formula "CBIAS" with the formula -- $C_{BIAS}$ --.
Line 37, please replace the line "divider and result in a" and replace the line:
-- divider and result in a stable target regulation voltage NEGP 540. --.

<u>Column 13,</u>
Line 48, please replace the formula
"$C_A = Ca + C_0 + C_{1+C2}.....C_N$" with the formula -- $C_A = Ca + C_0 + C_1 + C_2.....C_N$ --.

UNITED STATES PATENT AND TRADEMARK OFFICE
CERTIFICATE OF CORRECTION

PATENT NO.   : 6,515,903 B1
DATED        : February 4, 2003
INVENTOR(S)  : Binh Q. Le and Pau-Ling Chen It is certified that error appears in the above-identified patent and that said Letters Patent is hereby corrected as shown below:

Column 16,
Line 61, please replace the formula "REF" with the formula -- VREF --.
Line 63, please replace the word "ou" with the word -- output --.

Signed and Sealed this

Tenth Day of June, 2003

JAMES E. ROGAN
*Director of the United States Patent and Trademark Office*